United States Patent
Sakai et al.

(10) Patent No.: US 8,624,633 B2
(45) Date of Patent: Jan. 7, 2014

(54) OSCILLATOR CIRCUIT

(75) Inventors: Minoru Sakai, Tokyo (JP); Takayuki Nakamura, Tokyo (JP); Akira Komiya, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/495,131

(22) Filed: Jun. 13, 2012

(65) Prior Publication Data

US 2012/0326762 A1  Dec. 27, 2012

(30) Foreign Application Priority Data

Jun. 22, 2011 (JP) .................................. 2011-138439

(51) Int. Cl.
*H03B 5/30* (2006.01)

(52) U.S. Cl.
USPC .................... 327/87; 331/116 R; 331/116 FE; 331/160

(58) Field of Classification Search
USPC ......... 327/291, 292, 295, 296, 299, 101, 102, 327/113, 119, 140, 171, 178, 179, 306, 309, 327/311, 312, 323; 331/107 R, 108 R, 109, 331/114, 116 R, 116 FE, 108 A, 108 C, 138, 331/139, 154, 155, 158, 160

See application file for complete search history.

(56) References Cited

U.S. PATENT DOCUMENTS

| 5,047,734 | A  | * | 9/1991  | Newell et al. ................... 331/46 |
| 6,175,284 | B1 | * | 1/2001  | Sakurai et al. .......... 331/116 FE |
| 7,123,113 | B1 | * | 10/2006 | Brennan et al. ............... 331/158 |
| 8,044,731 | B2 | * | 10/2011 | Arai ........................ 331/116 FE |
| 2006/0071730 | A1 |   | 4/2006  | Nagatomo et al. |
| 2008/0136541 | A1 |   | 6/2008  | Yoshinaga |
| 2012/0126907 | A1 | * | 5/2012  | Nakamoto et al. ............. 331/155 |
| 2012/0242419 | A1 | * | 9/2012  | Tsai et al. ..................... 331/109 |

FOREIGN PATENT DOCUMENTS

JP  2006-129459  5/2006
JP  2008-147815  6/2008

* cited by examiner

*Primary Examiner* — Lincoln Donovan
*Assistant Examiner* — Jung H Kim
(74) *Attorney, Agent, or Firm* — IPUSA, PLLC

(57) ABSTRACT

An oscillator circuit includes an oscillator output signal generating circuit configured to generate an oscillator output signal using an oscillator as a resonator, an amplitude detection circuit configured to detect the amplitude of the oscillator output signal and compare the detected amplitude with a threshold; and a boost circuit configured to boost the oscillator output signal according to the result of the comparison at the amplitude detection circuit. The amplitude detection circuit includes an absolute value circuit configured to obtain an absolute value signal of the oscillator output signal, a low-pass filter configured to convert the absolute value signal into a low-frequency signal, and a comparator configured to compare the low-frequency signal with the threshold.

5 Claims, 5 Drawing Sheets

TIME

TIME

US 8,624,633 B2

OSCILLATOR CIRCUIT

CROSS-REFERENCE TO RELATED APPLICATION

The present application is based upon and claims the benefit of priority of Japanese Patent Application No. 2011-138439, filed on Jun. 22, 2011, the entire contents of which are incorporated herein by reference.

BACKGROUND OF THE INVENTION

1. Field of the Invention

An aspect of this disclosure is related to an oscillator circuit.

2. Description of the Related Art

Japanese Laid-Open Patent Publication 2008-147815, for example, discloses an oscillator circuit that generates an oscillator output signal using an oscillator as a resonator. The disclosed oscillator circuit includes two inverter circuits used as amplifier circuits and connected in parallel with the oscillator, and a timer for counting time from the start of oscillation. In the oscillator circuit, both of the inverter circuits are caused to operate for a predetermined period of time from the start of oscillation. After the predetermined period of time passes, only one of the inverter circuits is caused to operate and the other one of the inverter circuits is stopped. This configuration is intended to reduce the time necessary for the oscillation to stabilize and also to reduce power consumption.

Thus, according to the disclosed technology, boosting of the oscillator output signal is stopped when the time from the start of oscillation counted by the timer exceeds a predetermined value. However, characteristics of oscillators may vary depending on their types and individual differences. Therefore, if the timer is not properly set, boosting of the oscillator output signal may be stopped before the oscillator output signal stabilizes.

This problem may be prevented, for example, by using a method where boosting of an oscillator output signal is stopped when the amplitude of the oscillator output signal exceeds a predetermined value. Here, this method needs an amplitude detection circuit for outputting a signal Vs that changes when the amplitude of an oscillator output signal becomes greater than a predetermined value.

FIG. 1 illustrates an exemplary amplitude detection circuit that outputs a signal Vs. The amplitude detection circuit of FIG. 1 outputs the signal Vs using a pulse-width detection circuit. A comparator 4 of the amplitude detection circuit compares amplitude Vin of an oscillator output signal with a threshold voltage Vbias. Here, to monitor a high-frequency oscillation amplitude with a comparator as in this configuration, the comparator needs to have a high slew rate to be able to follow changes in input oscillation amplitude.

When Vout indicates the output voltage of a comparator, C indicates the capacitance of the comparator, and I indicates an electric current for charging and discharging the capacitance, the slew rate is expressed by formula (1) below.

$$SR = dVout/dt = I/C \tag{1}$$

As is apparent from formula (1), to increase the slew rate, it is necessary to increase the electric current I. Accordingly, increasing the slew rate of a comparator increases the power consumption of the comparator.

SUMMARY OF THE INVENTION

In an aspect of this disclosure, there is provided an oscillator circuit that includes an oscillator output signal generating circuit configured to generate an oscillator output signal using an oscillator as a resonator, an amplitude detection circuit configured to detect the amplitude of the oscillator output signal and compare the detected amplitude with a threshold; and a boost circuit configured to boost the oscillator output signal according to the result of the comparison at the amplitude detection circuit. The amplitude detection circuit includes an absolute value circuit configured to obtain an absolute value signal of the oscillator output signal, a low-pass filter configured to convert the absolute value signal into a low-frequency signal, and a comparator configured to compare the low-frequency signal with the threshold.

DESCRIPTION OF THE PREFERRED EMBODIMENTS

Figure 2:
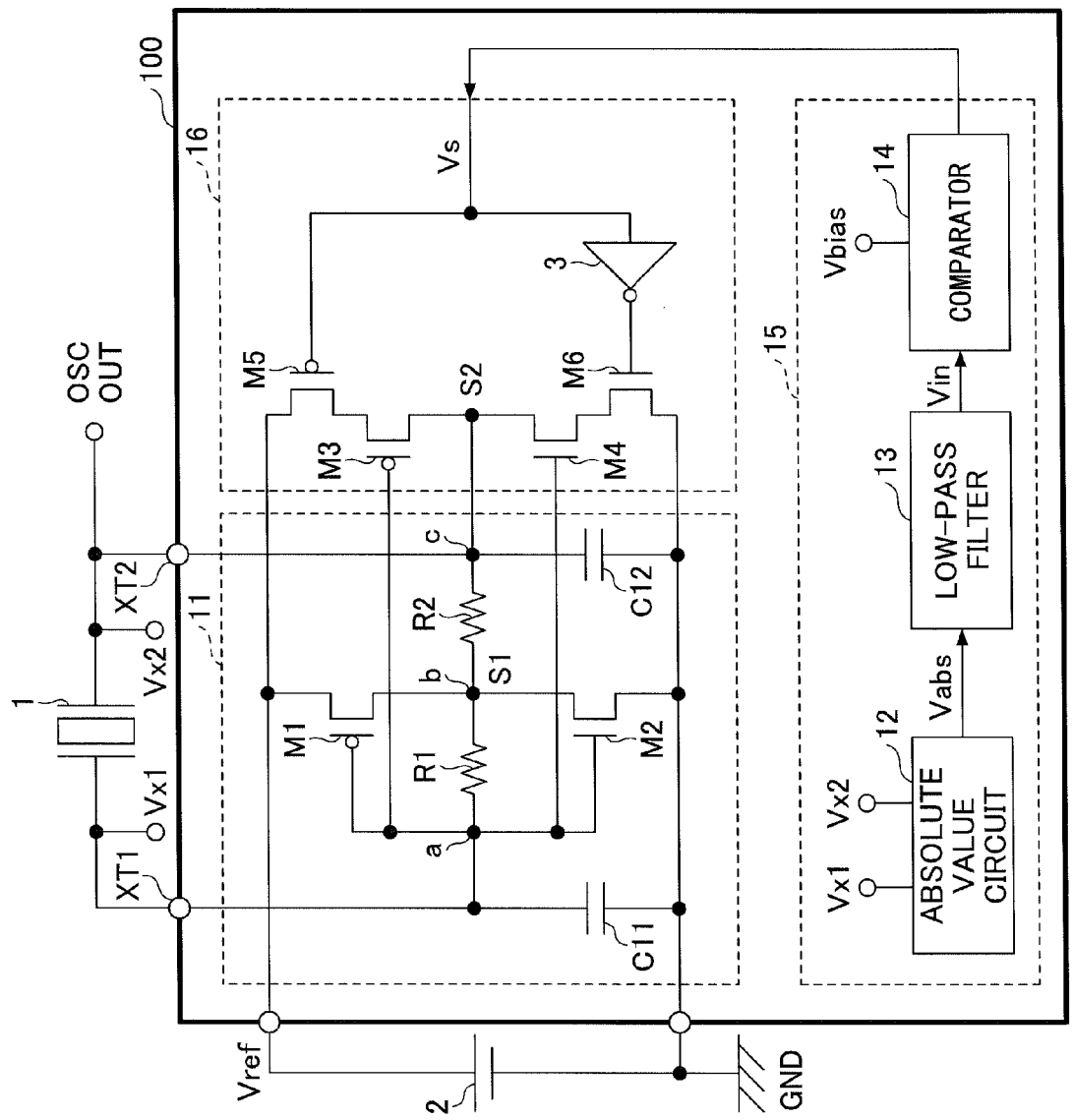
FIG. 2 is a circuit diagram of an oscillator circuit according to an embodiment.

Preferred embodiments of the present invention are described below with reference to the accompanying drawings. FIG. 2 is a circuit diagram of an oscillator circuit 100 according to an embodiment. The oscillator circuit 100 may include an oscillator output signal generating circuit 11 that generates an oscillator output signal Vx to be output from a terminal OSCOUT by using an crystal oscillator 1 as a resonator, an amplitude detection circuit 15 for detecting the amplitude of the oscillator output signal Vx, and a boost circuit 16 for boosting the oscillator output signal Vx according to an output signal Vs of the amplitude detection circuit 15. The amplitude detection circuit 15 may include an absolute value circuit 12 that receives the oscillator output signal Vx, a low-pass filter 13 that receives an output signal Vabs (absolute value signal) from the absolute value circuit 12, and a comparator 14 that receives an input signal Vin from the low-pass filter 13.

Figure 4A:
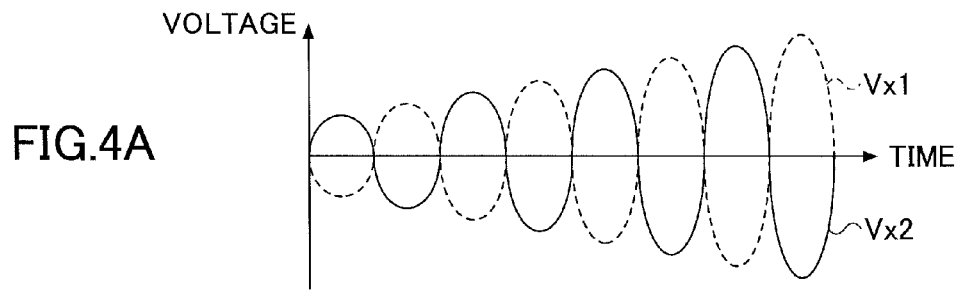
FIGS. 4A through 4D are time charts of signals.
Figure 4B:
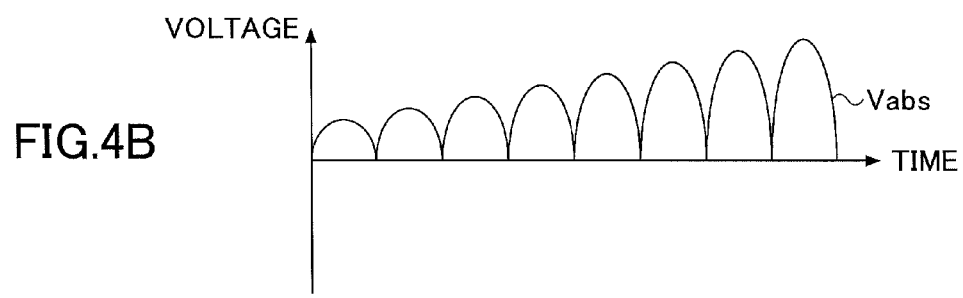
Figure 4C:
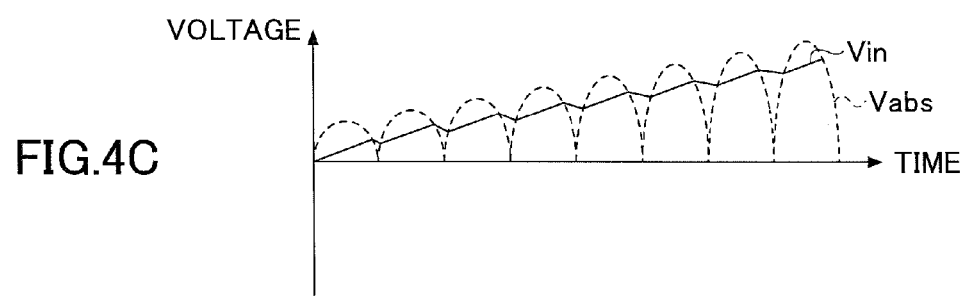

In the oscillator circuit 100 configured as described above, the high-frequency output signal Vabs (see FIG. 4B), which is the absolute value of the oscillator output signal Vx output from the absolute value circuit 12, is converted by the low-pass filter 13 into a low-frequency signal, and the low-frequency signal is input to the comparator 14 as the input signal Vin (see FIG. 4C). Converting the high-frequency oscillator output signal Vx into the low-frequency input signal Vin makes it possible to correctly detect the amplitude of the high-frequency oscillator output signal Vx even when the slew rate of the comparator 14 is low. This in turn makes it possible to reduce the electric current necessary to charge the parasitic capacitance in the comparator 14 and thereby makes it possible to reduce the power consumption of the comparator 14.

The configuration of the oscillator circuit 100 is described in more detail below.

As illustrated in FIG. 2, the oscillator circuit 100 is composed of semiconductor integrated circuits (IC), and includes the oscillator output signal generating circuit 11, the amplitude detection circuit 15, and the boost circuit 16. The crystal oscillator 1 is externally connected to the oscillator output signal generating circuit 11 of the oscillator circuit 100 via an input terminal XT1 and an output terminal XT2. The oscillator output signal generating circuit 11, the amplitude detection circuit 15, and the boost circuit 16 are driven by a constant reference voltage Vref supplied from a common power supply 2 as a supply voltage. Transistors illustrated in FIG. 2 may be implemented, for example, by metal-oxide-semiconductor field-effect transistors (MOSFET).

The oscillator output signal generating circuit 11 may include a CMOS inverter S1, a capacitor C11, a capacitor C12, and a feedback resistor R1, and generates the output signal Vx having a constant oscillation frequency and to be output from the terminal OSCOUT.

The CMOS inverter S1 includes a p-channel transistor M1 and an n-channel transistor M2, and is driven by the reference voltage Vref supplied from the power supply 2 as a supply voltage. The CMOS inverter S1 is connected in parallel with the crystal oscillator 1.

The capacitor C11 is connected between an input node "a" of the CMOS inverter S1 and a ground GND. The node "a" is connected to the terminal XT1.

The capacitor C12 is connected between an output node "b" of the CMOS inverter S1 and the ground GND. The node "b" is connected to the terminal XT2. The capacitor C12 may be connected between the output node "b" of the CMOS inverter S1 and the ground GND via a damping resistor R2. When the damping resistor R2 is inserted between the output node "b" and the ground GND, a node "c" between the damping resistor R2 and the capacitor C12 is connected to the terminal XT2. With the damping resistor R2 added, it is possible to reduce unintended spurious oscillations and to prevent an excessive increase in the amplitude of the oscillator output signal Vx.

The feedback resistor R1 is connected in parallel with the CMOS inverter S1, and is inserted between the node "a" and the node "b". DC voltages at the ends of the crystal oscillator 1 are substantially the same due to the feedback resistor R1. Also, voltages Vx1 and Vx2 at the corresponding ends of the crystal oscillator 1 can be adjusted to have the same amplitude by adjusting the capacitors C11 and C12.

Figure 4D:
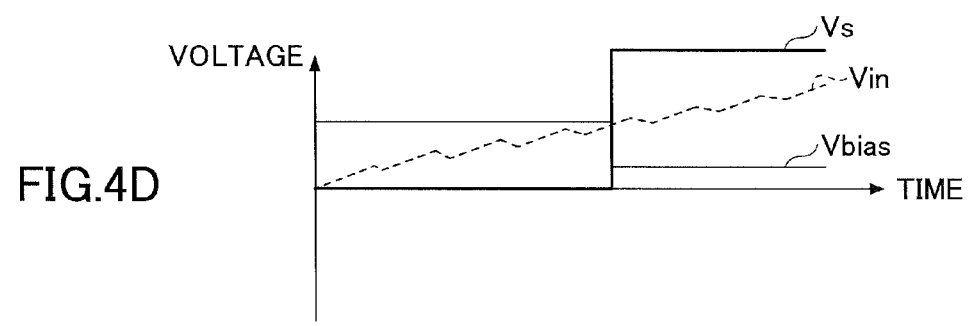

The amplitude detection circuit 15 may include the absolute value circuit 12, the low-pass filter 13, and the comparator 14. The absolute value circuit 12 obtains the absolute value of the oscillator output signal Vx. The absolute value circuit 12 receives the voltages Vx1 and Vx2 at the corresponding ends of the crystal oscillator 1, extracts positive parts of the voltages Vx1 and Vx2 with respect to the center of oscillation, and outputs the signal Vabs that is the absolute value of the oscillator output signal Vx, i.e., a signal that varies according to the amplitude of the oscillator output signal Vx. The low-pass filter 13 rectifies the output signal Vabs with large amplitude variations into a signal with small amplitude variations by averaging the output signal Vabs using a predetermined filter constant, and thereby generates the input signal Vin to be input to the comparator 14. The comparator 14 compares the input signal Vin with the threshold voltage Vbias, and outputs the comparison result as the signal Vs. More specifically, the comparator 14 sets the signal Vs at the low level when the input signal Vin is less than or equal to the threshold voltage Vbias, and sets the signal Vs at the high level when the input signal Vin is greater than the threshold voltage Vbias (see FIG. 4D). Here, since the amplitude of the input signal Vin is attenuated by the rectification and becomes smaller than that of the oscillation waveform, the threshold voltage Vbias is adjusted in proportion to the amount of attenuation.

Figure 3:
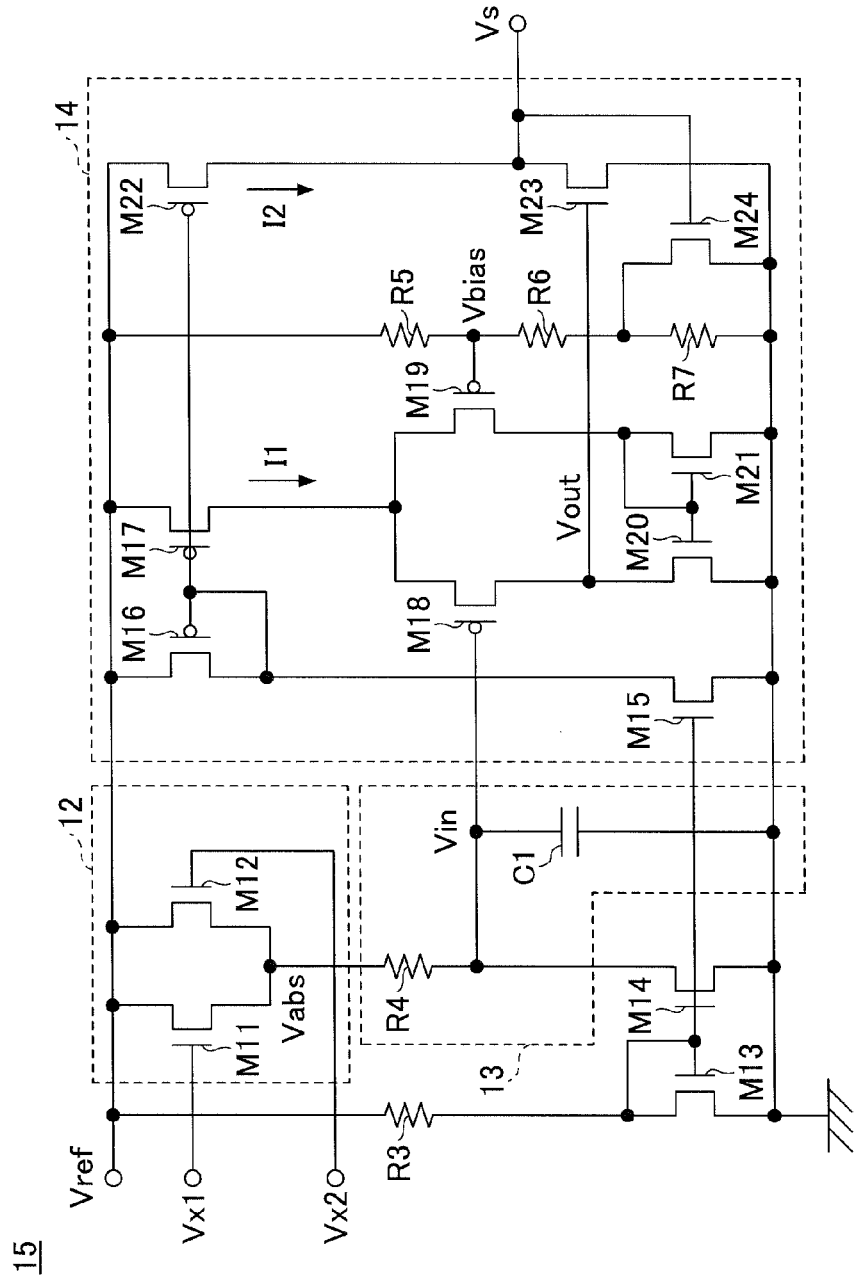
FIG. 3 is a circuit diagram of an amplitude detection circuit.

FIG. 3 is a circuit diagram of the amplitude detection circuit 15. FIG. 3 illustrates detailed configurations of the absolute value circuit 12, the low-pass filter 13, and the comparator 14.

The absolute value circuit 12 includes re-channel transistors M11 and M12 whose sources are commonly connected to an output node of the absolute value circuit 12. The gate of the transistor M11 is connected to the input terminal XT1 of the crystal oscillator 1 (see FIG. 2), and the gate of the transistor M12 is connected to the output terminal XT2 of the crystal oscillator 1 (see FIG. 2).

With this configuration, the absolute value circuit 12 receives the voltages Vx1 and Vx2 of the corresponding ends of the crystal oscillator 1 that have opposite phases (see FIG. 4A), and outputs the signal Vabs that is the absolute value of the oscillator output signal Vx (see FIG. 4B).

Also with the above configuration, the transistors M11 and M12 draw electric current from the power supply 2 at the same timing as the oscillator output signal generating circuit 11 and the boost circuit 16. Therefore, although the drains of the transistors M11 and M12 are supplied with the reference voltage Vref from the same power supply 2 that supplies power to the oscillator output signal generating circuit 11 and the boost circuit 16, the influence of ON/OFF of the transistors M11 and M12 on the operations of the oscillator output signal generating circuit 11 and the boost circuit 16 can be reduced compared with the circuit of FIG. 1. This in turn makes it possible to reduce the risk of causing a problem such as discontinuation of the oscillator output signal.

Figure 1:
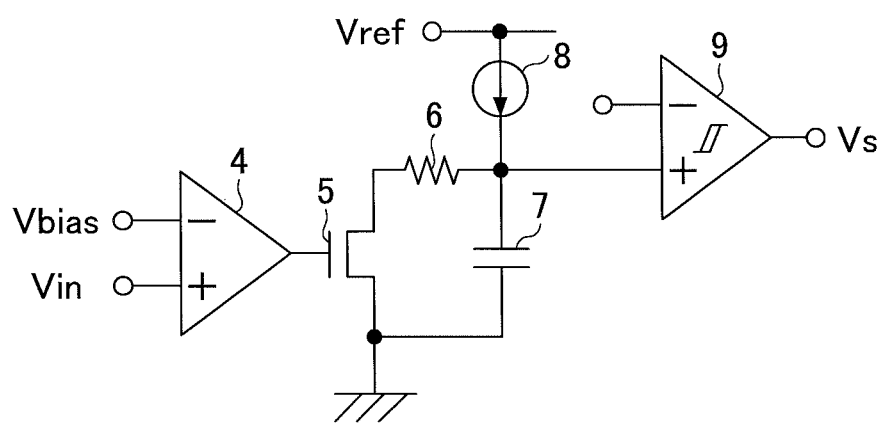
FIG. 1 is a circuit diagram of an amplitude detection circuit that outputs a signal Vs using a pulse-width detection circuit.

With the circuit configuration of FIG. 1, since pulses with a duty ratio different from that of the oscillator output signal Vx (the duty ratio of the oscillator output signal Vx is about 50%) are generated, a current source 8 draws electric current from the power supply 2 at a timing different from the oscillator output signal generating circuit 11 and the boost circuit 16. This may result in ripples in the reference voltage Vref which may influence the operations of the oscillator output signal generating circuit 11 and the boost circuit 16.

The low-pass filter 13 is a CR filter including a capacitor C1 and a resistor R4. One end of the resistor R4 is connected to the output node of the absolute value circuit 12. The node between the resistor R4 and the capacitor C1 is connected to the drain of an output transistor M14 of a current mirror that uses the reference voltage Vref as the operating voltage. With this configuration, the low-pass filter 13 outputs the signal Vin obtained by removing high-frequency components from the absolute value signal Vabs using the CR filter (see FIG. 4C). The current mirror also limits the amount of discharge of the capacitor C1 and limits the electric current of the absolute value circuit 12. In FIG. 3, the resistor R4 is provided between the absolute value circuit 12 and the current mirror. As a variation, the resistor R4 may be provided between the capacitor C1 and a node between the absolute value circuit 12 and the current mirror.

The comparator 14 includes a differential pair and a current mirror. The input signal Vin is input to the gate of a transistor M18 of the differential pair, and the threshold voltage Vbias is input to the gate of a transistor M19 of the differential pair. Since the comparator 14 is configured to compare the low-frequency input signal Vin with the threshold voltage Vbias, the slew rate of the comparator 14 may be low. This in turn makes it possible to reduce electric currents I1 and I2 necessary to charge the parasitic capacitance in the comparator 14 and thereby makes it possible to reduce the power consumption of the comparator 14.

The comparator 14 may also include a hysteresis circuit that provides hysteresis to the threshold voltage Vbias. The hysteresis circuit includes an n-channel transistor M24 whose gate is connected to the output node of the comparator 14. Turning the transistor M24 on and off changes the voltage division ratio of the resistors and thereby changes the threshold voltage Vbias. This configuration makes it possible to prevent a malfunction caused by unsmoothed ripples in the input signal Vin.

In FIG. 2, the boost circuit 16 stops boosting the oscillator output signal Vx when it is detected by the comparator 14 that the amplitude of the oscillator output signal Vx has exceeded a predetermined reference value. In other words, when a high-level signal Vs indicating that the input signal Vin has exceeded the threshold voltage Vbias is input, the boost circuit 16 stops boosting the oscillator output signal Vx.

The boost circuit 16 may include a CMOS inverter S2 for boosting the oscillator output signal Vx and a stop circuit (including an inverting circuit 3, a p-channel transistor M5, and an n-channel transistor M6) for stopping the operation of the CMOS inverter S2.

The gate of the transistor M5 is connected to the output node of the comparator 14, the source is connected to the reference voltage Vref, and the drain is connected to the source of a transistor M3 of the CMOS inverter S2. The gate of the transistor M6 is connected via the inverting circuit 3 to the output node of the comparator 14, the source is connected to the ground GND, and the drain is connected to the source of a transistor M4 of the CMOS inverter S2. This configuration makes it possible to control and stop the boosting operation of the CMOS inverter S2 of the boost circuit 16 according to the output signal Vs from the comparator 14.

The CMOS inverter S2 includes the p-channel transistor M3 and the n-channel transistor M4, and is driven by the reference voltage Vref supplied from the power supply 2 as a supply voltage. Input terminals of the CMOS inverter S2 (i.e., the gates of the transistors M3 and M4) are connected to the input terminals of the CMOS inverter S1. Output terminals of the CMOS inverter S2 (i.e., the drains of the transistors M3 and M4) are connected to the output terminals of the CMOS inverter S1. The output node "c" of the CMOS inverter S2 is connected to the capacitor 12 and the terminal XT2.

In the example of FIG. 2, the CMOS inverter S2 is connected in parallel with the CMOS inverter S1 via the damping resistor R2. The output node "b" of the CMOS inverter S1 is connected via the damping resistor R2 to the capacitor C12, and the output node "c" of the CMOS inverter S12 is directly connected to the capacitor C12 with no intervening damping resistor. The damping resistor R2 makes it possible to reduce unintended spurious oscillations. However, the damping resistor R2 causes loss and therefore reduces negative resistance. Here, as the negative resistance increases, the amplitude of the oscillator output signal Vx increases faster. According to the present embodiment, the node "c" of the CMOS inverter S2 of the boost circuit 16, which operates only during the startup, is connected to the capacitor C12 and the terminal XT2 with no intervening damping resistor. Compared with a case where the node "c" is also connected via a damping resistor, this configuration makes is possible to increase the speed or rate at which the amplitude of the oscillator output signal Vx increases. In other words, this configuration makes it possible to reduce the time necessary for the oscillation to stabilize.

The size of the transistors M3, M4, M5, and M6 of the boost circuit 16 may be smaller than the size of the transistors M1 and M2 of the CMOS inverter S1 of the oscillator output signal generating circuit 11. This configuration makes it possible to reduce the parasitic capacitance of the transistors M3, M4, M5, and M6, increase flicker noise that serves as initial noise for generating oscillations, and thereby increase the speed or rate at which the amplitude of the oscillator output signal Vx increases. The size of a transistor is defined by a gate length and a gate width. The gate length of the transistors M3, M4, M5, and ME is preferably 0.05-0.15 times greater than the gate length of the transistors M1 and M2. The gate width of the transistors M3, M4, M5, and M6 is preferably 0.06-0.2 times greater than the gate width of the transistors M1 and M2.

Figure 5:
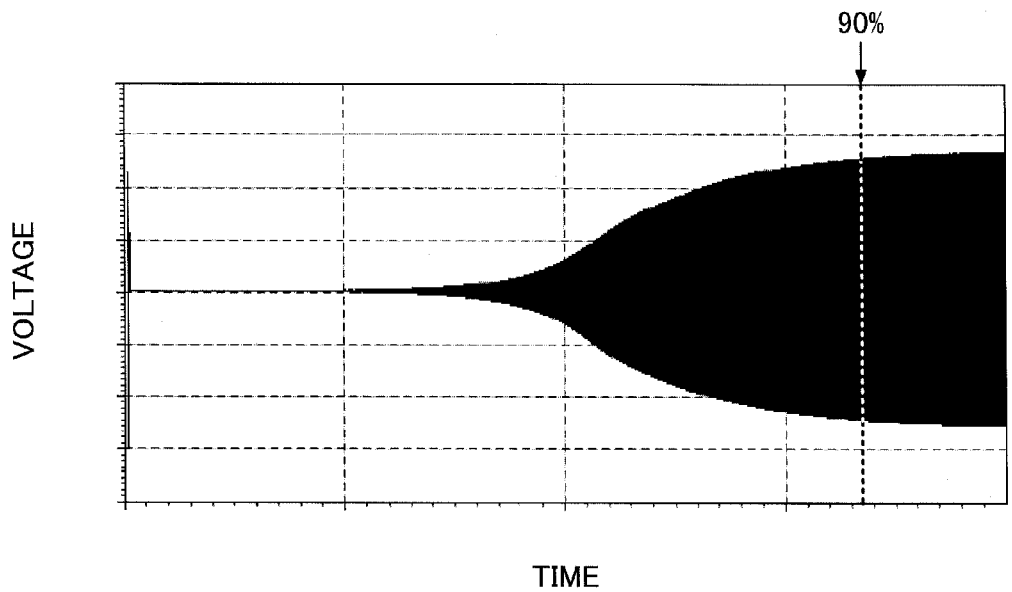
FIG. 5 is a graph illustrating results of simulating the start-up time of an oscillator circuit having no boost circuit.
Figure 6:
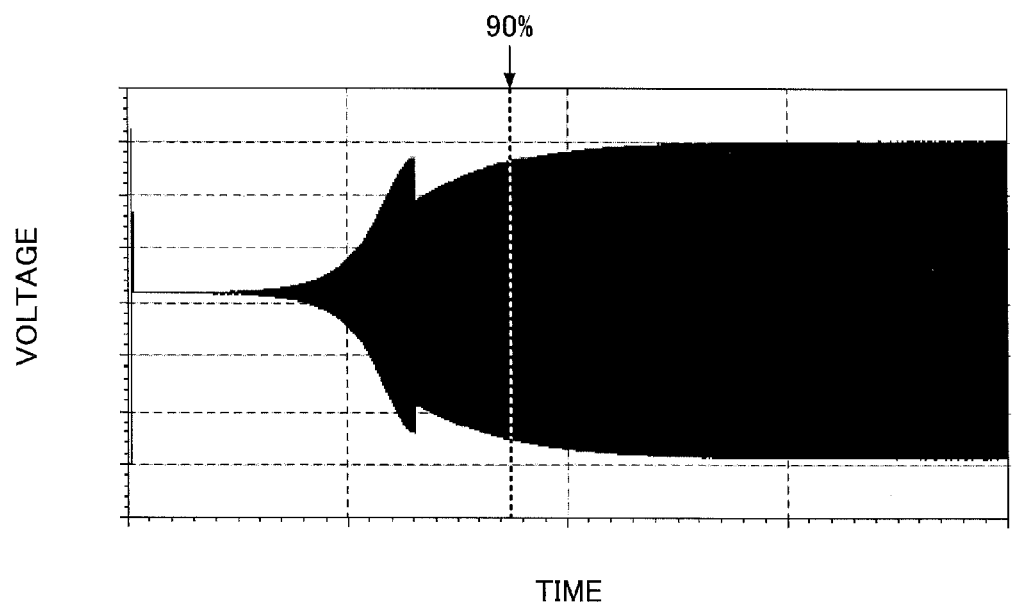
FIG. 6 is a graph illustrating results of simulating the start-up time of an oscillator circuit having a boost circuit.

FIGS. 5 and 6 illustrate results of simulating the start-up time necessary for the oscillator output signal Vx to stabilize. FIG. 5 illustrates the simulation results for an oscillator circuit of a comparative example that has a configuration where the amplitude detection circuit 15, the boost circuit 16, and the damping resistor R2 are removed from the oscillator circuit 100 of FIG. 2. FIG. 6 illustrates the simulation results for the oscillator circuit 100 of FIG. 2. In the simulation of FIGS. 5 and 6, the reference voltage Vref is set at 1.6 V, and the start-up time from when the reference voltage Vref is turned on until when the amplitude of the oscillator output signal Vx reaches 90% of the normal amplitude is measured. As illustrated in FIGS. 5 and 6, the start-up time of the oscillator circuit 100 of FIG. 2 is about 40% shorter than the start-up time of the oscillator circuit of the comparative example.

An aspect of this disclosure provides an oscillator circuit that makes it possible to detect the amplitude of a high-frequency oscillator output signal while reducing the power consumption of a comparator.

An oscillator circuit according to the embodiments is described above. However, the present invention is not limited to the specifically disclosed embodiments, and variations and modifications may be made without departing from the scope of the present invention.

For example, instead of a crystal oscillator, a ceramic oscillator may be used as a resonator for generating oscillations.

What is claimed is:

1. An oscillator circuit, comprising:
   an oscillator output signal generating circuit configured to generate an oscillator output signal using an oscillator as a resonator;
   an amplitude detection circuit configured to detect an amplitude of the oscillator output signal and compare the detected amplitude with a threshold; and
   a boost circuit configured to boost the oscillator output signal according to a result of the comparison at the amplitude detection circuit,
   wherein the amplitude detection circuit includes
      an absolute value circuit configured to obtain an absolute value signal of the oscillator output signal,
      a low-pass filter configured to convert the absolute value signal into a low-frequency signal, and
      a comparator configured to compare the low-frequency signal with the threshold.

2. The oscillator circuit as claimed in claim 1, wherein
   the absolute value circuit includes a first transistor and a second transistor that are commonly connected to an output node of the absolute value circuit;
   a gate of the first transistor is connected to an input terminal of the oscillator; and a gate of the second transistor is connected to an output terminal of the oscillator.

3. The oscillator circuit as claimed in claim 2, wherein the first transistor and the second transistor are configured to be supplied with power from a same power supply that supplies power to the oscillator output signal generating circuit and the boost circuit.

4. The oscillator circuit as claimed in claim 1, wherein
the oscillator output signal generating circuit includes a first CMOS inverter connected in parallel with the oscillator;
the boost circuit includes a second CMOS inverter configured to boost the oscillator output signal;
an output node of the first CMOS inverter is connected via a damping resistor to a capacitor provided at an output side of the oscillator; and
an output node of the second CMOS inverter is connected directly to the capacitor.

5. The oscillator circuit as claimed in claim 4, wherein a size of transistors constituting the second CMOS inverter is less than a size of transistors constituting the first CMOS inverter.

* * * * *